(12) United States Patent
Rasbornig et al.

(10) Patent No.: US 9,581,657 B2
(45) Date of Patent: Feb. 28, 2017

(54) MAGNETIC FIELD SENSOR DEVICE USING DIFFERENT TYPES OF MAGNETIC FIELD SENSORS

(71) Applicant: Infineon Technologies AG, Neubiberg (DE)

(72) Inventors: Friedrich Rasbornig, Klagenfurt (AT); Armin Satz, Villach (AT); Christoph Schroers, Villach (AT)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 14/789,751

(22) Filed: Jul. 1, 2015

(65) Prior Publication Data

US 2016/0011279 A1 Jan. 14, 2016

(30) Foreign Application Priority Data

Jul. 10, 2014 (DE) .......... 10 2014 109 656

(51) Int. Cl.
  *G01R 33/02* (2006.01)
  *G01R 33/00* (2006.01)

(52) U.S. Cl.
  CPC ..... *G01R 33/0094* (2013.01); *G01R 33/0029* (2013.01)

(58) Field of Classification Search
  CPC ...... G01R 33/09; G01R 33/02; G01R 33/072; G01R 33/0035; G01R 33/077; G01R 31/2829; G01R 33/06; G01R 33/07; G01R 15/202; G01R 33/0206; G01R 33/0023; G01R 15/205; G01R 31/007; G01R 33/0094; G01P 15/003; G01P 1/07; G01P 3/00; G01P 3/42; G01P 3/481; G01P 3/488; G01P 3/49; G01P 3/505; G01P 3/487; G01P 21/02; G01P 3/443; G01P 3/489; G01P 13/04; G01P 13/045; H03K 17/90; G01N 27/72; F02P 7/067; F02P 7/07; F02P 9/00; G01C 21/206; H02P 31/00

See application file for complete search history.

(56) References Cited

U.S. PATENT DOCUMENTS

| 8,102,175 B2* | 1/2012 | Rossler | B82Y 25/00 324/207.21 |
| 2009/0322325 A1* | 12/2009 | Ausserlechner | G01D 5/145 324/260 |
| 2012/0194175 A1* | 8/2012 | Ausserlechner | G01D 5/2451 324/207.14 |
| 2012/0229128 A1* | 9/2012 | Satz | G01R 33/093 324/244 |
| 2013/0200909 A1* | 8/2013 | Rasbornig | G01R 31/3187 324/750.3 |

FOREIGN PATENT DOCUMENTS

| DE | 102004017191 A1 | 10/2005 |
| DE | 102005022596 A1 | 11/2006 |
| DE | 102005039280 A1 | 2/2007 |
| DE | 102011017698 A1 | 3/2012 |

* cited by examiner

*Primary Examiner* — Vinh Nguyen
(74) *Attorney, Agent, or Firm* — Shumaker & Sieffert, P.A.

(57) ABSTRACT

Devices, methods and systems are disclosed using a first magnetic field sensor of a first type and a second magnetic field sensor of a second type different from the first type. A signal from the first sensor may be used in a first magnetic field, range, and a signal from the second sensor may be used in a second magnetic field range.

20 Claims, 3 Drawing Sheets

MAGNETIC FIELD SENSOR DEVICE USING DIFFERENT TYPES OF MAGNETIC FIELD SENSORS

This Application claims priority to German Patent Application number 102014109656.8 filed on Jul. 10, 2014, the entire content of which is incorporated herein by reference.

TECHNICAL FIELD

The present application relates to magnetic field sensor devices, apparatuses and systems comprising such magnetic field sensor devices and to corresponding methods.

BACKGROUND

Magnetic field sensors are used in many applications. For example, for speed or movement detection, magnets may for example be provided on a so-called pole wheel, thus generating a modulated magnetic field when the pole wheel rotates. The modulation of the field may then be detected by a magnetic field sensor. The magnetic field detected thereby and its modulation are then indicative for example of a rotational speed of the pole wheel. Instead of a pole wheel for example also a tooth wheel or a linear magnetic element generating a modulated magnetic field when moving may be used. For such a speed detection, in many applications, for example in some automotive applications, a high accuracy and low jitter are required. For example, low jitter may be required for indirect tire pressure monitoring systems (iTPMS).

Besides detecting the speed, in some applications it is desirable to also obtain some measure of the absolute magnetic field. For example, in some applications an absolute magnetic field may be indicative of an air gap between a sensor and for example a pole wheel, tooth wheel or linear magnetic element as mentioned above. In some applications, such an absolute magnetic field may be in a comparatively large range, starting from very low magnetic fields.

SUMMARY

It is therefore an object of the present application to provide magnetic field sensor devices able to reliably sense a magnetic field over a comparatively wide range.

In some embodiments, a magnetic field sensor device comprises: a first magnetic field sensor of a first type, a second magnetic field sensor of a second type different from the first type, and signal processing circuitry, the signal processing circuitry being adapted to determine a magnetic field strength based on an output signal of the first magnetic field sensor in a first magnetic field strength range and based on an output signal of the second magnetic field sensor in a second magnetic field strength range different from the first magnetic field strength range.

In some embodiments, an apparatus comprises a movable magnetic element, and a magnetic field sensor device arranged adjacent to the movable magnetic element, wherein the magnetic field sensor device comprises: a first magnetic field sensor of a first type, a second magnetic field sensor of a second type different from the first type, and signal processing circuitry, the signal processing circuitry being adapted to determine a magnetic field strength based on an output signal of the first magnetic field sensor in a first magnetic field strength range and based on an output signal of the second magnetic field sensor in a second magnetic field strength range different from the first magnetic field strength range.

In some embodiments, a method comprises: using a signal from a first magnetic field sensor of a first type in a first magnetic field range, and using a signal from a second magnetic field sensor of a second type different from the first type in a second magnetic field range different from the first magnetic field range.

Additional details of these and other embodiments and features are described below and defined by the claims.

DETAILED DESCRIPTION

Figure 1:
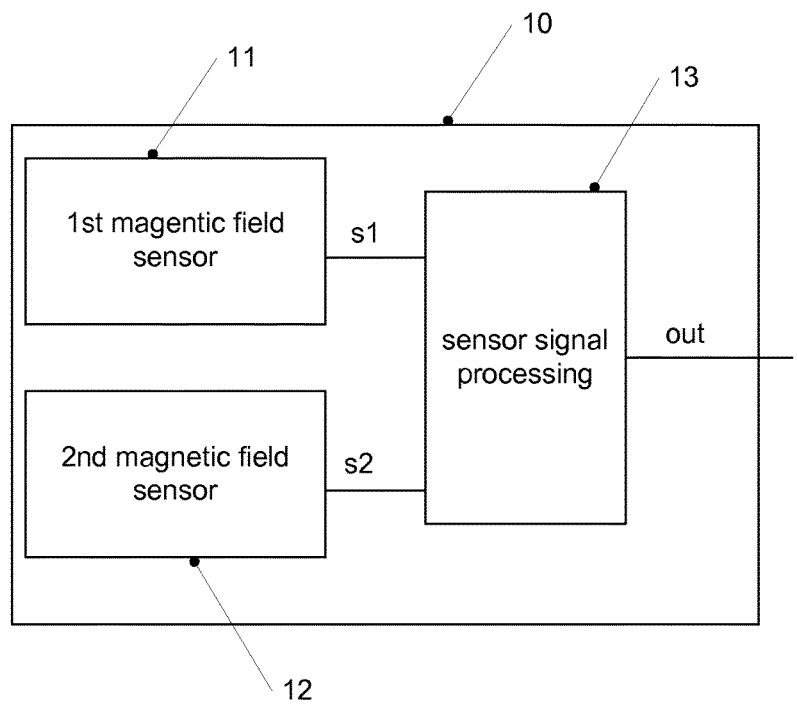
FIG. 1 is a block diagram of a sensor device according to an embodiment.

In the following, various embodiments will be described in detail with reference to the attached drawings. It is to be noted that these embodiments serve illustrative purposes only and are not to be construed as limiting. For example, while embodiments may be described as comprising a plurality of different details, features or elements, in other embodiments, some of these details, features or elements may be omitted, may be implemented in a different manner than shown, and/or may be replaced by alternative details, features or elements. Additionally or alternatively, in other embodiments, additional details, features or elements not explicitly described herein may be present.

Connections or couplings, for example electrical connections or couplings shown in the drawings or described herein may be direct connections or couplings or also indirect connections or couplings. Indirect connections or couplings may be connections or couplings with one or more additional intervening elements, as long as the general function of the respective connection or coupling, for example to transmit a certain kind of information or signal, is essentially maintained. Furthermore, connections or couplings may be implemented as wire-based connections or couplings or as wireless connections or couplings unless specifically noted otherwise.

Some embodiments relate to magnetic field sensors. A magnetic field sensor may for example comprise an XMR sensor. The term XMR sensor as used herein may refer to sensors being based on one or more magnetoresistive (MR) effects. Examples for magnetoresistive effects include GMR (giant magnetoresistance), CMR (colossal magnetoresistance), AMR (anisotropic magnetoresistance) or TMR (tunneling magnetoresistance). In another example, a magnetic field sensor may comprise a Hall sensor. Hall sensors in the context of this application may be sensors relying on the Hall effect to detect a magnetic field. Examples for Hall sensors include vertical Hall sensors or lateral Hall sensors. Vertical Hall sensors may have a sensitivity direction in a plane parallel to a surface of a substrate in which the Hall sensor is implemented, while lateral Hall sensors may have a sensitivity direction orthogonal to a surface of a substrate in which the Hall sensor is implemented. Sensitivity direction as used herein may refer to a direction of magnetic fields to which the sensor is sensitive, i.e. which may be measured by the sensor. Hall sensors may be operated based on any conventional technique, for example a spinning current technique or any other biasing technique.

In some embodiments, a magnetic field sensor device may comprise a first magnetic field sensor and a second magnetic field sensor. The first magnetic field sensor may be of a first type, and the second magnetic field sensor may be of a second type different from the first type. The magnetic field sensor device may further comprise sensor signal processing circuitry receiving a first output signal from the first magnetic field sensor and a second output signal from the second magnetic field sensor. The sensor signal processing circuitry may be adapted to use the first output signal for a magnetic field measurement in a first range, and may use the second output signal for a magnetic field measurement in a second range different from the first range. In some embodiments, by using the first and second magnetic field sensors for the first and second ranges, respectively, types of sensors appropriate for the respective range may be used. This in some embodiments may improve measurement quality.

In some embodiments, the magnetic field measurement may be indicative of a distance like an air gap between the sensor device and a magnetic device like a pole wheel, tooth wheel or a linear magnetic element.

In some embodiments, the first output signal may be used for at least one of a speed measurement and a direction measurement. In some embodiments, a third magnetic field sensor may be provided, a third output signal of the third magnetic field sensor being used for the other one of the speed measurement and the direction measurement. The third magnetic field sensor in some embodiments may be of the first type.

In some embodiments, the first magnetic field sensor may comprise a bridge circuit, and/or the third magnetic field sensor may comprise a monocell.

In some embodiments, the first type may be an XMR type, and the second type may be a Hall sensor type. In such an embodiment, the first range may comprise smaller magnetic fields than the second range. In some embodiments, the first range may comprise magnetic fields of the order of 50 µT or below, although in other embodiments other values may be used. In some embodiments, the second magnetic field sensor may comprise a vertical hall sensor.

Turning now to the figures, in FIG. 1 a magnetic field sensor device 10 according to an embodiment is illustrated. Magnetic field sensor device 10 in the embodiment illustrated comprises a first magnetic field sensor 11 and a second magnetic field sensor 12. First magnetic field sensor 11 may be of a first type, and second magnetic field sensor 12 may be of a second type different from the first type. For example, in an embodiment first magnetic field sensor 11 may be an XMR sensor, and second magnetic field sensor 11 may comprise a Hall sensor. XMR sensors and Hall sensors may differ with respect to their properties. For example, an XMR sensor in some implementations may have very low jitter or noise, which makes them useful for some applications like indirect tire pressure monitoring applications. In such applications, a tire pressure may be deduced from measuring a rotational speed of a tire e.g. via a pole wheel or tooth wheel, for example by evaluating harmonics of the measured signal. Furthermore, XMR sensors in some implementations may have low offset drifts and small dependency of magnetic sensitivity on mechanical stress effects, which may be caused by humidity or packaging effects. Furthermore, in some implementations XMR sensors may measure very small magnetic fields, for example of the order of 50-200 µT.

However, XMR sensors in some implementations may have a comparatively small linear range of about 3-6 mT, and may exhibit saturation effects outside the linear range. Moreover, XMR sensors may be sensitive to stray fields and/or fields in a direction orthogonal to a sensitivity direction.

On the other hand, Hall sensors in some implementations may have a linear range extending e.g. over some 100 mT. Moreover, Hall sensors may be comparatively more robust to external magnetic fields (stray fields) in a direction different from a sensitive direction. On the downside, Hall sensors in some implementations may have a relatively high jitter or noise compared to some XMR sensors, and may experience a comparatively high offset drift if no compensation is provided. Moreover, Hall sensors may in some cases be more susceptible to mechanical stress effects than XMR sensors, and may not be able to sense very small magnetic fields, for example below 500 µT. It should be noted that any numeric values given above serve only illustration purposes, and depending on the implementation other values may apply.

In the embodiment of FIG. 1, first magnetic field sensor 11 outputs a first sensor signal s1, and second magnetic field sensor 12 outputs a second sensor signal s2. Output signals s1, s2 are received by sensor signal processing circuitry 13. Sensor signal processing circuitry 13 may generate at least one output signal out indicating a magnetic field strength of a magnetic field sensed by magnetic field sensor device 10. For example, output signal out may indicate a value of an absolute magnetic field strength or may indicate a normalized magnetic field strength. In an embodiment, sensor signal processing circuitry 13 may determine the field strength based on signal s1 in a first magnetic field strength range, and based on signal s2 for a second magnetic field strength range. For example, in embodiments where first magnetic field sensor 11 is an XMR sensor and second magnetic field sensor 12 is a Hall sensor, the first range may comprise smaller magnetic fields than the second range. In such a case, device 10 uses an XMR sensor for comparatively small magnetic field strengths and a Hall sensor for comparatively large magnetic field strengths.

It should be noted that besides magnetic field, strength, sensor signal processing circuitry 13 may also transmit other information in the at least one output signal out, for example information indicative of a speed based on a modulation of the magnetic field sensed. Such a modulation may for example occur when e.g. a pole wheel, tooth wheel or linear magnetic device moves adjacent to magnetic field sensor device 10. In still other embodiments, additionally or alternatively information indicative of a movement direction may be encoded in the at least one output signal out. Other techniques may also be employed.

Furthermore, in some embodiments, the signal processing circuitry 13 may check sensor signals s1, s2 for consistency. For example, if the first magnetic field sensor 11 and second magnetic field sensor 12 produce incompatible results, the at least one output signal out may comprise a warning or alert.

Such an inconsistency may for example occur when second magnetic field sensor 12 senses a magnetic field, but first magnetic field sensor 11 does not sense a magnetic field, or if the sensed values are incompatible with each other. In some embodiments, using different types of magnetic field sensors may provide diversity to the consistency check. Other techniques may also be employed.

In some embodiments, magnetic field sensor device 10 may be implemented on a single chip as an integrated device.

Figure 2:
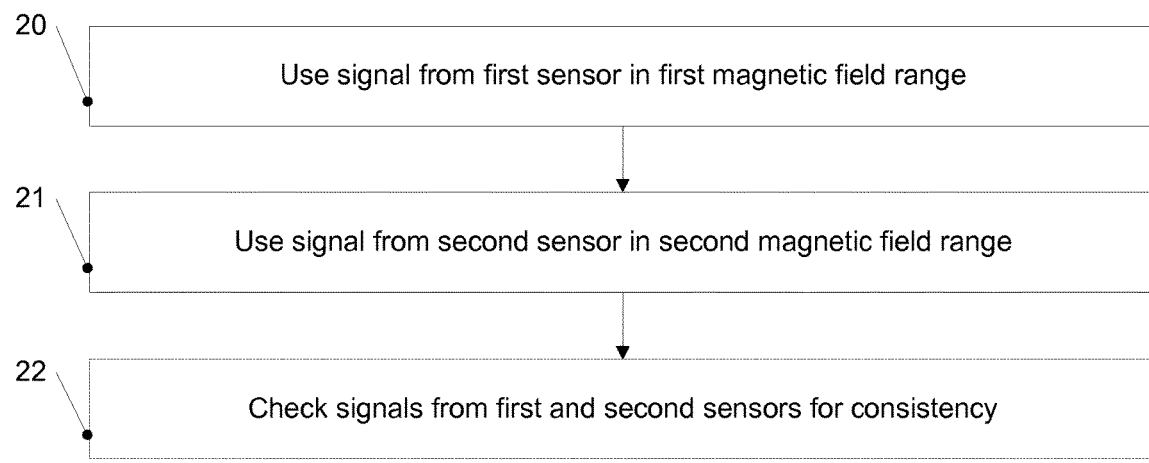
FIG. 2 is a flowchart illustrating a method according to an embodiment.

In FIG. 2, a flowchart illustrating a method according to an embodiment is illustrated. While the method of FIG. 2 is illustrated as a series of acts or events, an order in which such acts or events are illustrated is not to be construed as limiting, and in other embodiments, other orders may be used. Furthermore, acts or events illustrated may be performed repetitively. In some embodiments, additional acts or events to the once explicitly described in FIG. 2 may be provided.

The method illustrated in FIG. 2 may be implemented using the device of FIG. 1 or using a device described later with respect to FIG. 3 or 4, but is not limited thereto.

At 20, an output signal from a first magnetic field sensor is used for measuring magnetic fields in a first magnetic field range. In some embodiments, the first magnetic field sensor may comprise an XMR sensor.

At 21, an output signal form a second magnetic field sensor is used in a second magnetic field range different from the first magnetic field range. The second magnetic field sensor may be of a different type than the first magnetic field sensor. In some embodiments, the second magnetic field sensor may comprise a Hall sensor. In some embodiments, the second magnetic field, range may comprise magnetic field values greater than magnetic field values of the first magnetic field range. However, in some embodiments, the ranges may also overlap.

Optionally, at 22 in some embodiments signals from the first and second magnetic field sensors may be checked for consistency, for example to detect errors or failures in the sensors.

In some embodiments, the signal from the first magnetic field sensor and/or from the second magnetic field sensor may also be used for other purposes than detecting a magnetic field strength, for example for measuring a modulation of a magnetic field which may be indicative of a speed, or to determine a direction of movement.

Figure 3:
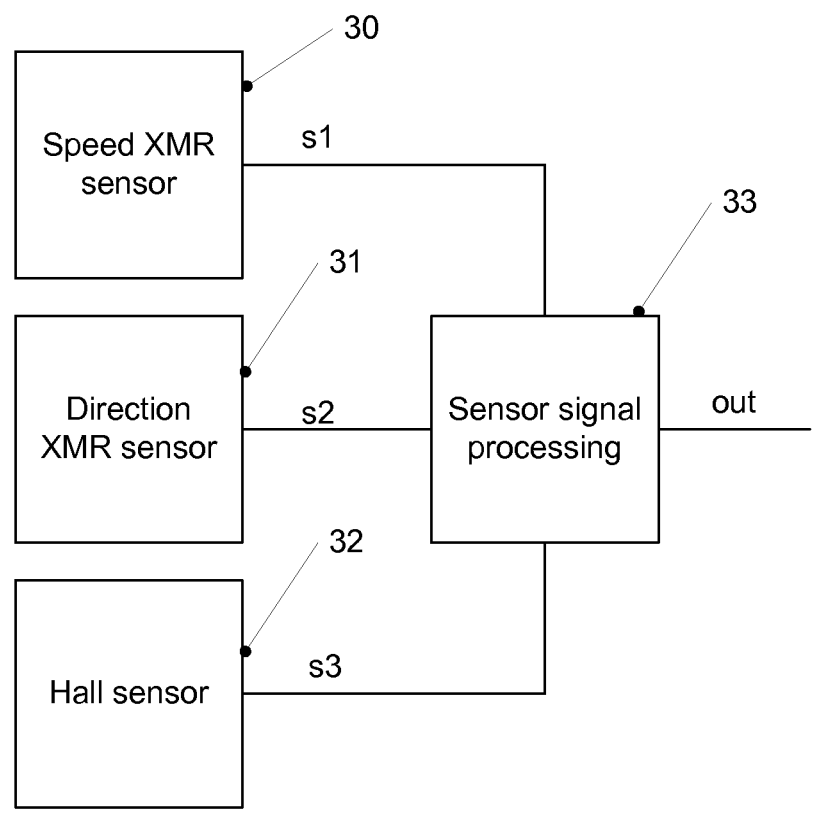
FIG. 3 is a block diagram of a sensor device according to a further embodiment.

FIG. 3 Illustrates a sensor device according to another embodiment. The sensor device illustrated in FIG. 3 is adapted to perform speed measurements, for example measuring a rotational speed of a pole wheel or tooth wheel or a linear speed of a linear magnetic device moving adjacent to the sensor device. In some embodiments, the sensor device of FIG. 3 may be used in automotive applications, for example for measuring a wheel speed or measuring a rotation of a steering column. However, the use of the sensor device of FIG. 3 is not limited to such applications.

The sensor device of FIG. 3 comprises a first XMR sensor 30, a second XMR sensor 31 and a Hall sensor 32. First XMR sensor 30 outputs a first sensor signal s1, second XMR sensor 31 outputs a second sensor signal s2 and Hall sensor 32 outputs a third sensor signal s3. First to third sensor signals s1-s3 are fed to sensor signal processing circuitry 32, which generates at least one output signal out based on sensor signals s1-s3.

In some embodiments, first XMR sensor 30 may comprise a bridge circuit, and/or second XMR sensor 31 may comprise a monocell.

In the embodiment of FIG. 3, sensor signal processing circuitry 33 may provide an indication of a speed, for example a speed of a pole wheel, tooth wheel or linear magnetic element, in output signal out based on sensor signal s1. Furthermore, sensor signal processing circuitry 33 in the embodiment of FIG. 3 may provide an indication of movement speed in the at least one output signal out based on sensor signal s2.

Furthermore, in the embodiment of FIG. 3 sensor signal processing circuitry 33 may provide information regarding the strength of the magnetic field sensed in the at least one output signal out. For example, an absolute magnetic field strength may be indicated, or a normalized magnetic field strength (for example normalized to a specific predetermined value) may be given as a measure of the absolute magnetic field strength. In some cases, such a normalized magnetic field strength may be indicated, as an N-bit value, for example a 3-bit value.

The magnetic field strength may be obtained based on sensor signal s1 and/or sensor signal s2 in a first magnetic field strength range, and based on sensor signal s3 in a second magnetic field strength range. The first magnetic field strength range may comprise values smaller than values of the second magnetic field strength range. In some embodiments, in this case for small magnetic field strength properties of first XMR sensor 30 and/or second XMR sensor 31 like low jitter and good sensitivity to low magnetic fields may be used, whereas for higher magnetic fields for example a higher linear range of a Hall sensor like Hall sensor 32 may be used.

In some embodiments, the information regarding the magnetic field strength may be representative of an air gap between a magnetic device like a pole wheel, tooth wheel or linear magnetic device and the sensor device of FIG. 3.

Figure 4:
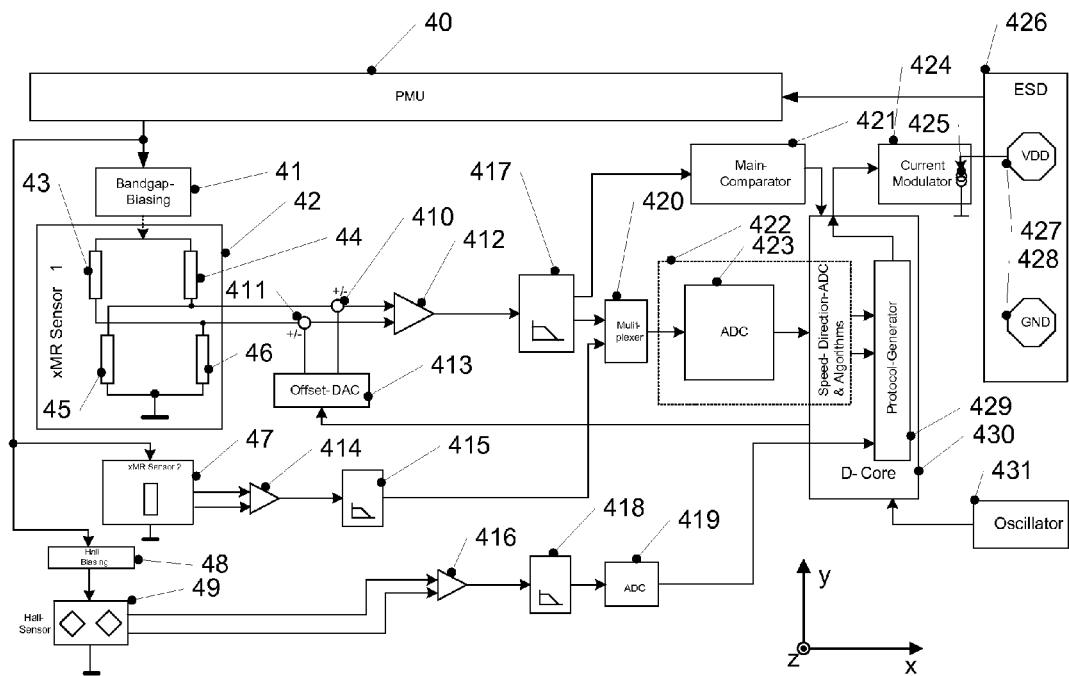
FIG. 4 is a detailed diagram illustrating a sensor device according to an embodiment.

FIG. 4 illustrates a sensor device according to a further embodiment. The sensor device illustrated in FIG. 4 is adapted to perform speed measurements, for example measuring a rotational speed of a pole wheel or tooth wheel or a linear speed of a linear magnetic device. In some embodiments, the sensor device of FIG. 4 may be used in automotive applications, for example for measuring a wheel speed or measuring a rotation of a steering column. However, the use of the sensor device of FIG. 4 is not limited to such applications.

The sensor device of FIG. 4 comprises a first XMR sensor 42, a second XMR sensor 47 and a Hail sensor 49. First and second XMR sensors 42, 47 are not limited to any particular type of XMR sensors, but may for example be GMR sensors or TMR sensors. As illustrated in FIG. 4, first XMR sensor 42 may be designed as a bridge circuit with XMR elements 43-46. As further illustrated, second XMR sensor 47 in some embodiments may be designed as a monocell with a single XMR element. However, this is not to be construed as limiting, and in other embodiments first XMR sensor 42 may be designed as a monocell, and/or second XMR sensor 47 may be designed as a bridge circuit.

Furthermore, in some embodiments, Hall sensor 49 may comprise a vertical Hall sensor, but is not limited thereto. In some embodiments, the arrangement of XMR elements in XMR sensors 42, 47 may be in a plane as illustrated in FIG. 4. In such a configuration, sensors 42, 47 and 49 may be at least mainly sensitive to magnetic fields in the x-direction, the x-direction being indicated in the lower right corner of FIG. 4. In some embodiments, Hall sensor 49 may be insensitive to magnetic field components in the y- and z-direction. In some embodiments, XMR sensors 42, 47 may be insensitive to magnetic field components in the z-direction, but may to some extent be disturbed by magnetic field components in the y-direction. In other embodiments, other configurations may be used.

In some embodiments, first XMR sensor 42 may be used for detection of a speed like a rotational speed or a linear speed via a detection of a modulation of a magnetic field. Furthermore, in some embodiments, second XMR sensor 47 may be used for detecting a movement direction, for example, a rotation direction or a direction of a linear movement, using conventional techniques. Furthermore, sensors 42, 47 and 49 may be used to detect an absolute magnetic field strength. In a speed sensing application, such an absolute magnetic field strength may indicate an air gap between the sensor device and a magnetic device like a pole wheel or a linear magnetic element. In some embodiments, first XMR sensor 42 and/or second XMR sensor 47 may be used to sense the absolute magnetic field strength in a first field strength range, and Hall sensor 49 may be used to sense an absolute magnetic field strength in a second field strength range, for example, with higher magnetic field strength values than the first magnetic field strength range. For example, an XMR sensor and a Hall sensor may be used to detect magnetic field in ranges as indicated in the below table:

|  | Magnetic Field [mT] | Sensor-Type |
| --- | --- | --- |
| Protocol air gap indication | 0.0500 | XMR Sensor |
|  | 0.1000 |  |
|  | 0.3500 |  |
|  | 0.5000 |  |
|  | 1.0000 | Hall Sensor |
|  | 1.5000 |  |
|  | 3.0000 |  |
|  | 5.0000 |  |
|  | 6.0000 |  |

The above numerical values serve merely illustrative purposes, and in other embodiments and implementations other values may apply.

By way of giving a non-limiting example, an air gap corresponding to the sensed magnetic field strength may be communicated via a normalized N-bit value, for example, a three-bit value, corresponding to $2^N$ different levels. For example, the so-called AK (Arbeitskreis)-protocol used in some automotive applications like ABS (anti-lock braking system) applications requires a transmission of an indication of an air gap.

Besides, the sensors 42, 47 and 49 discussed above, the device illustrated in FIG. 4 comprises further components, for example, sensor signal processing circuitry or supply circuitry for the sensors. The various components depicted in FIG. 4 serve merely as examples, and other embodiments may include different components or elements.

The various components illustrated in FIG. 4 may be implemented on a single chip in some embodiments.

Furthermore, while different blocks are shown in FIG. 4, one or more blocks may be implemented in common circuit portions in some embodiments.

Next, as an example supply circuitry components of the embodiment of FIG. 4 will be discussed.

The device of FIG. 4 in the embodiment illustrated receives power via a VDD terminal 427 and a ground terminal 428. VDD terminal 427 and ground terminal 428 (as well as other terminals not explicitly shown) may be protected by ESD (electrostatic discharge) protection circuitry 426. ESD protection circuitry 426 may be implemented in a conventional manner.

Via terminals 427, 428, a power management unit (PMU) 40 is supplied, which in turn supplies the various components of the sensor device with power. For example, first XMR sensor 42 is biased by a band gap biasing circuit 41. Hall sensor 49 in the embodiment of FIG. 4 is supplied via a Hall biasing circuit 48. Also second XMR sensor 47 is supplied via PMU 40. In other embodiments, other supply techniques may apply.

Next, a path used for processing signals from first XMR sensor 42 will be discussed.

Signals from a node between XMR elements 44 and 45 and from a node between XMR elements 43 and 46 are fed to an amplifier 412. In some embodiments, signals for offset compensation may be added by adders/subtractors 410, 411 as illustrated. A signal output by amplifier 412 is fed to a low pass filter 417, for example to filter out higher frequency disturbances. An output of low pass filter 417 is fed to a main comparator 421, which may compare for example the output signal with a threshold value in order to detect e.g. zero crossings of a modulated magnetic field. A frequency of such zero crossings may be indicative of a speed. An output signal of main comparator 421 is fed to a digital core 430.

Furthermore, an output signal of low pass filter 417 is fed to an analog-to-digital converter (ADC) 423 via a multiplexer 420. Analog-to-digital converter 423 provides a digital signal representation of the magnetic field captured by first XMR sensor 411. Analog-to-digital converter 423 may for example have a resolution (e.g. bit width) of about 11 to 14 bits, but is not limited to this range.

As indicated by a box 422, the digital signal output by ADC 423, possibly together with an output from main comparator 421, is used by a speed algorithm of digital core 430 to derive a speed, for example a rotational speed of a pole wheel or tooth wheel or a linear speed of a linear magnetic element.

Next, a signal processing path for second XMR sensor 47 will be discussed.

An output signal of second XMR sensor 47 is fed to an amplifier 414. An output signal of amplifier 414 is fed to a low pass filter 415. Low pass filter 415 may be used for example to remove higher frequency disturbances. An output signal of low pass filter 415 is fed to the already discussed multiplexer 420. Multiplexer 420 selectively forwards either the output signal of low pass filter 417 or the output signal of low pass filter 415 to ADC 423. When the output signal of low pass filter 415 is forwarded, as again indicated by box 422, a direction algorithm in digital core 430 determines a movement direction based on the digital signal representation output by ADC 423.

An output of Hall sensor 49 is fed to an amplifier 416, followed by a low pass filter 418. Low pass filter 418 may serve to remove or reduce the higher frequency disturbances. An output of low pass filter 418 is fed to an analog-to-digital converter (ADC) 419. In some embodiments, amplifier 416, low pass filter 418 and/or analog-to-digital converter 419 may have a comparatively simple design. For example, an optimization with respect to noise performance may be omitted for some application, and/or a resolution of analog-to-digital converter 419 may be comparatively low. For example, a resolution (e.g. bit width) of analog-to digital converter 419 may be different from, for example lower than, a resolution (e.g. bit width) of analog-to-digital converter 423. For example, analog-to digital converter 419 may have a four-bit resolution or lower, e.g. or a three-bit resolution. In some embodiments, analog-to digital converter 419 may have a different design than analog-to-digital converter 423 and/or may be different types of analog-to-digital converters. In some embodiments, such a comparatively simple design may reduce chip space required. In some embodiments, a reduced chip area may lead to a lower susceptibility to errors, which in turn may make it easier to fulfill safety requirements.

Next, the functioning of digital core 430 will be briefly discussed.

Digital core is clocked by an oscillator 431. As already mentioned previously, from digital representations of signals from first XMR sensor 42, digital core 430 obtains a speed information in the embodiment shown. Furthermore, from the digital representation of the signal from second XMR sensor 47, digital core 430 obtains a movement direction information. Furthermore, digital core 430 comprises a protocol generator 429 which encodes the speed and direction information according to a desired protocol, for example, AK-protocol for automotive applications or any other protocol. In addition to speed and direction information, an information regarding absolute magnetic field strength indicative of an air gap is encoded in some embodiments. The magnetic field strength in a first field strength range, for example as illustrated in the above table, in the embodiment of FIG. 4 may be generated based on the signal from first XMR sensor 42 and/or second XMR sensor 47. For a second field strength range greater than the first range, the magnetic field strength may be obtained based on the sent signal from Hall sensor 49.

In the embodiment of FIG. 4, the information is sent by current modulation in a current modulator 424 having a current source 425. In some embodiments, the information may be encoded according to the AK-protocol. However, application of the techniques disclosed herein is not limited to the AK-protocol, and other protocols and techniques for transmitting information may also be used.

In embodiments, digital core 430 may also perform consistency checks between the signals of sensors 42, 47 and 49 to detect failures or errors. For example, as already explained, the results regarding magnetic field strengths may be compared for consistency. Furthermore, if one of the sensors does not provide a signal while another one of the sensors does provide a signal, this may indicate an error.

Digital core 430 in the embodiment of FIG. 4 also provides an offset correction value to a digital-to-analog converter (DAC) 413, and output signals of DAC 413 are fed to adders/subtractors 410 and 411, as shown.

It should be noted that providing separate sensor paths for the three sensors as illustrated in FIG. 4 may increase likelihood of error detection in some embodiments, as then the paths are largely independent from each other. On the other hand, providing independent paths may consume more chip area. Therefore, e.g. depending on safety requirements, different sensors may use common elements, or may use different elements. For example, in the embodiment of FIG. 4, XMR sensors 42 and 47 via multiplexer 420 use a common analog-to-digital converter 423, while Hall sensor 49 uses a separate analog-to-digital converter 419. In other embodiments, analog-to-digital converter 419 may be omitted, and an output signal of low pass filter 418 may also be fed to multiplexer 420. This may make incorrect operation of ADC 423 harder to detect (as then it is the only ADC and influences all sensor signals), but may reduce chip area and thus manufacturing costs.

In other embodiments, for example, separate analog-to-digital converters may be provided for XMR sensors 42 and 47. In such an embodiment, for example in FIG. 4 instead of multiplexer 420 an additional analog-to-digital converter may be provided. This may provide additional functional safety and/or may be advantageous in some high frequency applications (e.g. where high rotational speeds have to be measured), for example some gear drive applications. On the other hand, providing separate analog-to-digital converters for XMR sensors 42 and 47 may increase a required chip area. In yet other embodiments, other elements like low pass filters or amplifiers may be shared between sensors.

Figure 5:
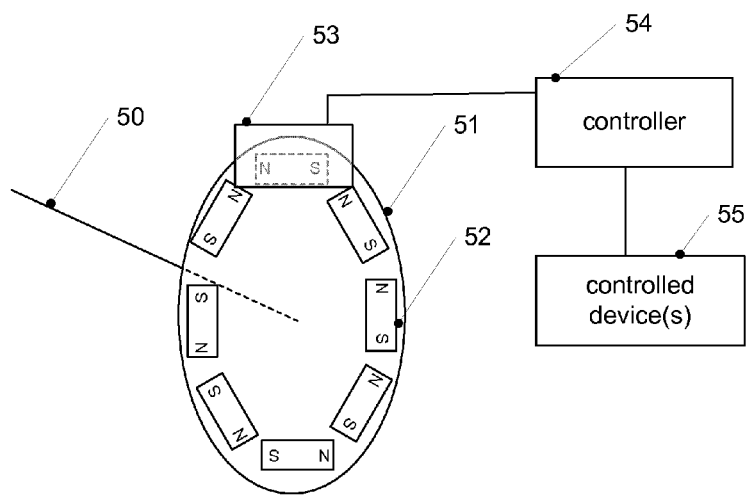
FIG. 5 is a schematic diagram illustrating an apparatus according to an embodiment.

Next, with reference to FIG. 5, an example apparatus will be described. The apparatus of FIG. 5 comprises a magnetic field sensor device 53 which may for example be implemented as illustrated with respect to FIG. 1 or with respect to FIG. 3 or FIG. 4. Magnetic field sensor device 53 is placed adjacent to a pole wheel 51 which is coupled with an rotation axis 50. For example, rotation axis 50 may be coupled no a wheel of a car, to enabling measuring of a wheel speed, or may be coupled with a steering column of a core. However, application of the apparatus of FIG. 5 is not limited to automotive application. In other embodiments, instead of pole wheel 51 another magnetic device generating a modulated magnetic field when moving, e.g. a tooth wheel or a linear magnetic device, may be used.

Pole wheel 51 comprises a plurality of magnets 52 arranged along its circumference. Magnets 52 may be permanent magnets or may be for example electromagnets. The number and/or arrangement of the magnets may differ from the one shown for illustration purposes in FIG. 5.

When axis 50 and therefore pole wheel 51 rotates, magnetic field sensor device experiences a modulated magnetic field. This may be used for detection of speed and/or direction, as explained previously. Furthermore, magnetic field sensor device 53 may use two different magnetic field sensors for two different ranges to determine an absolute field strength, which may be indicative of an air gap between sensor device 53 and pole wheel 51.

An output of sensor device 53 is fed to a controller 54. In an automotive application, controller 54 may for example be an electronic control unit (ECU) of a vehicle. Depending on the received signal, controller 54 may control one or more controlled devices 55. For example, in case of a wheel speed sensing application, controlled devices 55 may comprise components of an anti-lock braking system (ABS), or in case of a rotation detection of a steering column controlled devices 55 may comprise devices relating to steering a vehicle. However, these applications merely serve as non-limiting examples for illustration purposes and are not to be construed as limiting.

Example 1

A magnetic field sensor device, comprising:
a first magnetic field sensor of a first type,
a second magnetic field sensor of a second type different from the first type, and
signal processing circuitry, the signal processing circuitry being adapted to determine a magnetic field strength based on an output signal of the first magnetic field sensor in a first magnetic field strength range and based on an output signal of the second magnetic field sensor in a second magnetic field strength range different from the first magnetic field strength range.

Example 2

The device of example 1, wherein the first magnetic field sensor comprises an XMR sensor.

Example 3

The device of example 1 or 2, wherein the second magnetic field sensor comprises a Hall sensor.

Example 4

The device of any one of examples 1-3, wherein the second range comprises magnetic field strength values greater than magnetic field strength values of the first range.

Example 5

The device of any one of examples 1-4, wherein the sensor signal processing circuitry is adapted to obtain information regarding a distance between the sensor device and a magnetic element based on the magnetic field strength.

Example 6

The device of any one of examples 1-5, wherein the sensor signal processing circuitry is adapted to check the output signals from the first and second magnetic field sensor, for consistency.

Example 7

The device of any one of examples 1-6, wherein the sensor signal processing circuitry is adapted to obtain at least one of a speed information or a direction information from the output signal of the first magnetic field sensor.

Example 8

The device of example 7, further comprising a third magnetic field sensor, wherein the sensor signal processing circuitry is adapted to obtain at least the other one of speed direction and direction information from an output signal of the third magnetic field sensor.

Example 9

The device of example 8, wherein the third magnetic field sensor is of the first type.

Example 10

The device of any one of examples 1-9, wherein a sensitivity direction of the first magnetic field sensor essentially is the same as a sensitivity direction of the second magnetic field sensor.

Example 11

The device of any one of examples 1-10, further comprising a first analog-to-digital converter coupled to an output of the first magnetic field sensor, and a second analog-to-digital converter coupled to an output of the second magnetic field sensor.

Example 12

The device of example 11, wherein the second analog-to-digital converter has a resolution different from a resolution of the first analog-to-digital converter.

Example 13

The device, of example 12, wherein the resolution of the second analog-to-digital converter is smaller than a resolution of the first analog-to-digital converter and/or wherein the resolution of the second analog-to-digital converter is 4 bits or less.

Example 14

An apparatus, comprising:
a movable magnetic element, and
a magnetic field sensor device of any one of examples 1-13 arranged adjacent to the movable magnetic element.

Example 15

The example of claim 14, wherein the movable magnetic element comprises at least one of a pole wheel, a tooth wheel or a linear magnetic element.

Example 16

The apparatus of example 14 or 15, further comprising a controller coupled to an output of the magnetic field sensor device, the controller being adapted to control at least one controlled device based on an output of the magnetic field sensor device.

Example 17

The apparatus of example 16, wherein the controlled device comprises at least one of an antilock breaking system device or a steering device.

Example 18

A method, comprising:
using a signal from a first magnetic field sensor of a first type in a first magnetic field range, and
using a signal from a second magnetic field sensor of a second type different from the first type in a second magnetic field range different from the first magnetic field range.

Example 19

The example of claim 18, further comprising checking signals from the first and second magnetic field sensors for consistency.

Example 20

The method of example 18 or 19, further comprising obtaining at least one of speed information or direction information from the first magnetic field sensor.

It should be noted that the embodiments discussed above serve merely as examples, and are not to be construed as limiting. In particular, many variations and alterations are possible while still applying the basic techniques disclosed herein.

What is claimed is:
1. A magnetic field sensor device, comprising:
a first magnetic field sensor of a first type configured to output a first sensor signal that indicates a magnetic field strength of a magnetic field as detected by the first magnetic field sensor;
a second magnetic field sensor of a second type different from the first type and configured to output a second sensor signal that indicates the magnetic field strength of the magnetic field as detected by the second magnetic field sensor and signal processing circuitry configured to:
determine the magnetic field strength of the magnetic field based on the first sensor signal of the first magnetic field sensor when the first sensor signal indicates that the strength of the magnetic field is within a first magnetic field strength range and based on the second sensor signal of the second magnetic field sensor when the second sensor signal indicates that the strength of the magnetic field is within a second magnetic field strength range different from the first magnetic field strength range; and
output an indication of the determined magnetic field strength.

2. The device of claim 1, wherein the first magnetic field sensor comprises an XMR sensor.

3. The device of claim 2, wherein the second magnetic field sensor comprises a Hall sensor.

4. The device of claim 1, wherein the second range comprises magnetic field strength values greater than magnetic field strength values of the first range.

5. The device of claim 1, wherein the sensor signal processing circuitry is adapted to obtain information regarding a distance between the sensor device and a magnetic element based on the magnetic field strength.

6. The device of claim 1, wherein the sensor signal processing circuitry is adapted to check the output signals from the first and second magnetic field sensors for consistency.

7. The device of claim 1, wherein the sensor signal processing circuitry is adapted to obtain at least one of a speed information or a direction information from the output signal of the first magnetic field sensor.

8. The device of claim 7, further comprising a third magnetic field sensor, wherein the sensor signal processing circuitry is adapted to obtain at least the other one of speed direction and direction information from an output signal of the third magnetic field sensor.

9. The device of claim 8, wherein the third magnetic field sensor is of the first type.

10. The device of claim 1, wherein a sensitivity direction of the first magnetic field sensor essentially is the same as a sensitivity direction of the second magnetic field sensor.

11. The device of claim 1, further comprising a first analog-to-digital converter coupled to an output of the first magnetic field sensor, and a second analog-to-digital converter coupled to an output of the second magnetic field sensor.

12. The device of claim 11, wherein the second analog-to-digital converter has a resolution different from a resolution of the first analog-to-digital converter.

13. The device of claim 12, wherein the resolution of the second analog-to-digital converter is smaller than a resolution of the first analog-to-digital converter and/or wherein the resolution of the second analog-to-digital converter is 4 bits or less.

14. An apparatus, comprising:
a movable magnetic element, and
a magnetic field sensor device arranged adjacent to the movable magnetic element, wherein the magnetic field sensor device comprises:
a first magnetic field sensor of a first type configured to output a first sensor signal that indicates a magnetic field strength of a magnetic field as detected by the first magnetic field sensor,
a second magnetic field sensor of a second type different from the first type and configured to output a second sensor signal that indicates the magnetic field strength of the magnetic field as detected by the second magnetic field sensor, and
signal processing circuitry configured to:
determine the magnetic field strength of the magnetic field based on the first sensor signal of the first magnetic field sensor when the first sensor signal indicates that the strength of the magnetic field is within a first magnetic field strength range and based on the second sensor signal of the second magnetic field sensor when the second sensor signal indicates that the strength of the magnetic field is within a second magnetic field strength range different from the first magnetic field strength range; and
output an indication of the determined magnetic field strength, the determined magnetic field strength indicating a gap between the magnetic field sensor device and the movable magnetic element.

15. The apparatus of claim 14, wherein the movable magnetic element comprises at least one of a pole wheel, a tooth wheel or a linear magnetic element.

16. The apparatus of claim 14, further comprising a controller coupled to an output of the magnetic field sensor device, the controller being adapted to control at least one controlled device based on an output of the magnetic field sensor device.

17. The apparatus of claim 16, wherein the controlled device comprises at least one of an antilock breaking system device or a steering device.

18. A method, comprising:
receiving a first sensor signal that indicates a magnetic field strength of a magnetic field as detected by a first magnetic field sensor of a first type;
receiving a second sensor signal that indicates the magnetic field strength of the magnetic field as detected by a second magnetic field sensor of a second type different from the first type;
determine the magnetic field strength of the magnetic field using the first sensor signal from the first magnetic field sensor when the first sensor signal indicates that the strength of the magnetic field is within a first magnetic field range, and using the second sensor signal from the second magnetic field sensor when the second sensor signal indicates that the strength of the magnetic field is within a second magnetic field range different from the first magnetic field range; and
outputting an indication of the determined magnetic field strength.

19. The method of claim 18, further comprising checking signals from the first and second magnetic field sensors for consistency.

20. The method of claim 18, further comprising obtaining at least one of speed information or direction information from the first magnetic field sensor.

* * * * *